United States Patent

Navid et al.

[11] Patent Number: 6,138,000
[45] Date of Patent: Oct. 24, 2000

[54] LOW VOLTAGE TEMPERATURE AND $V_{CC}$ COMPENSATED RF MIXER

[75] Inventors: Nasrollah Saeed Navid, Saratoga; Ali Fotowat-Ahmady, San Rafael; Farbod Behbahani, Iglewood, all of Calif.

[73] Assignee: Philips Electronics North America Corporation, New York, N.Y.

[21] Appl. No.: 08/517,155

[22] Filed: Aug. 21, 1995

[51] Int. Cl.[7] .................................. H04B 1/26
[52] U.S. Cl. .................. 455/326; 455/319; 455/332; 455/333; 327/113; 327/358; 331/176
[58] Field of Search ......................... 455/318, 313, 455/323, 325, 326, 319, 330, 332, 333; 331/176; 327/359, 358, 361, 113

[56] References Cited

U.S. PATENT DOCUMENTS

| | | | |
|---|---|---|---|
| 4,344,188 | 8/1982 | Tanabe et al. | 455/326 |
| 4,369,522 | 1/1983 | Cerny, Jr. et al. | 455/333 |
| 4,479,259 | 10/1984 | Fenk | 455/318 |
| 5,379,457 | 1/1995 | Nguyen | 455/323 |
| 5,446,923 | 8/1995 | Martinson et al. | 455/330 |
| 5,548,840 | 8/1996 | Heck | 455/326 |
| 5,630,228 | 5/1997 | Mittel | 455/326 |

FOREIGN PATENT DOCUMENTS

| | | |
|---|---|---|
| 0416889A2 | 3/1991 | European Pat. Off. . |
| 0587136A2 | 3/1994 | European Pat. Off. . |

*Primary Examiner*—Reinhard J. Eisenzopf
*Assistant Examiner*—Philip J. Sobutka
*Attorney, Agent, or Firm*—Brian J. Wieghaus

[57] ABSTRACT

An RF mixer utilizing frequency and bias compensation for improved performance characteristics. The RF mixer receives bias signals that are dependent on $V_{CC}$ levels to internally balance the local oscillation received and mix the perfectly bias balanced internally generated oscillation signal with the RF input.

11 Claims, 4 Drawing Sheets

LOW VOLTAGE TEMPERATURE AND $V_{CC}$ COMPENSATED RF MIXER

BACKGROUND OF THE INVENTION

1. Field of the Invention

The present invention relates to RF mixers. More particularly, it relates to a more linearized RF mixer utilizing frequency and bias compensation for improved performance.

2. The Prior Art

Presently, a standard Gilbert cell is used for mixer designs in RF circuits. A gilbert cell generally consists of a single or double differential pair of transistors in the lower tree of the mixer. Under low voltage conditions, second order effects such as the IF output riding on the large local oscillator feed-through, will cause clipping of the IF signal and result in intermodulation products. In addition, small $V_{BE}$ changes caused by temperature or second order bias dependencies will cause current and gain variations that limit the performance of the circuit. It is therefore desireable to have an RF mixer that operates independent of temperature changes and variations in the $V_{CC}$ level.

SUMMARY OF THE INVENTION

The present invention provides an RF mixer that uses frequency and bias compensation to improve performance.

According to the invention, an oscillator circuit provides the required local oscillator (LO) signal and an offset current signal to the mixer circuit. A bias network circuit generates a bias voltage signal and a bias current signal which are fed into the mixer circuit. The offset current signal and the bias current signal balance the internally generated LO signal applied to the upper tree of the mixer. The bias current signal is dependent on $V_{CC}$ values and thereby compensates the mixer for changes in the $V_{CC}$ level. The bias voltage signal biases the lower tree of the mixer circuit to prevent any changes in the temperature and $V_{CC}$ levels from effecting the mixing of the LO and RF inputs.

It is therefore an object of the present invention to provide an RF mixer that compensates for changes in temperature and $V_{CC}$ levels.

It is another object of the invention to provide an RF mixer that utilizes bias signals dependent on the $V_{CC}$ levels to optimize the signal swing headroom at all temperature and $V_{CC}$ conditions.

It is yet another object of the invention to provide an RF mixer that uses an offset current signal to internally generate a perfectly balanced LO differential pair to the external LO signal for mixing with the RF input.

Another object of the invention is to provide and RF mixer that overcomes the shortfalls of the prior art.

It is a further object of the invention to provide an RF mixer that operates efficiently and reliably.

BRIEF DESCRIPTION OF THE DRAWINGS

Other objects and features of the present invention will become apparent from the following detailed description considered in connection with the accompanying drawings which disclose an embodiment of the present invention. It should be understood, however, that the drawings are designed for the purpose of illustration only and not as a definition of the limits of the invention.

In the drawings, wherein similar reference characters denote similar elements throughout the several views.

DETAILED DESCRIPTION OF PREFERRED EMBODIMENTS

Figure 1:
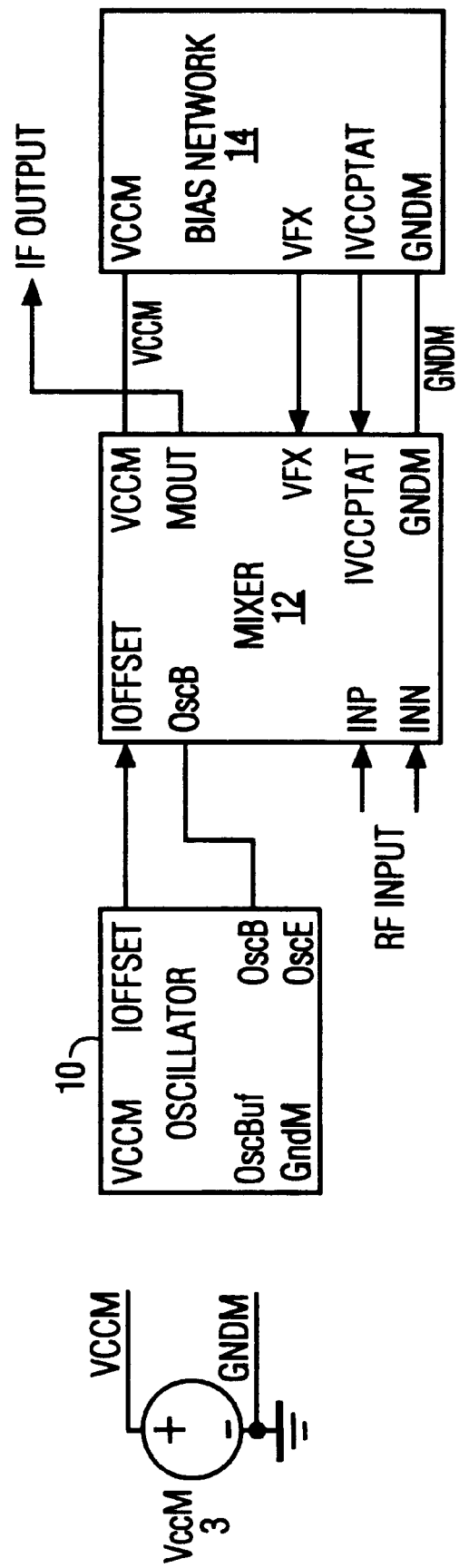
FIG. 1 is a block diagram of the circuit according to the invention.

Turning now in detail to the drawings, FIG. 1 is a block diagram of the RF mixer showing the interconnections of the oscillator 10, mixer 12 and bias network 14 according to the invention. The $V_{ccm}$ voltage is the power supply pin for all blocks, and the GndM is the ground for all blocks.

Mixer 12 has a positive input INP and a negative input INN for receiving an RF input signal. Oscillator 10 generates the requisite local oscillator (LO) signal needed for the mixer, and also provides an offset current signal IOFFSET to aid in the balancing of the mixer operation.

Figure 2:
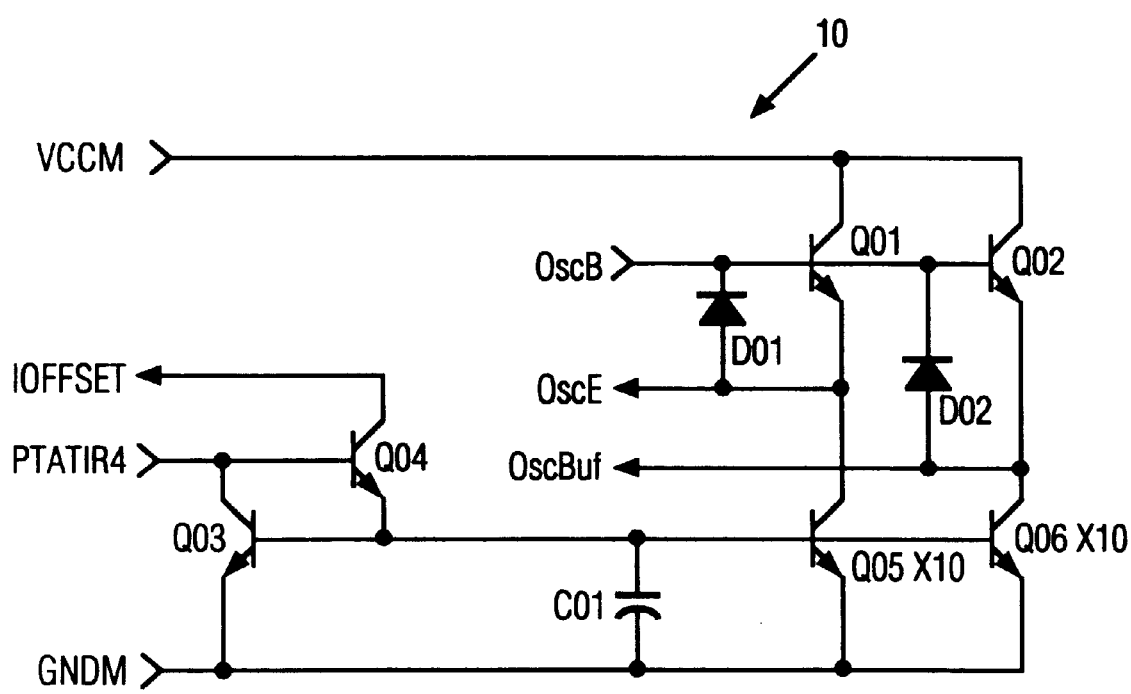
FIG. 2 is a schematic diagram of the oscillator/buffer of FIG. 1 according to the invention.

FIG. 2 is a schematic circuit diagram of oscillator 10 according to the invention. Transistor QO1 performs the oscillator function. A resonating element can be connected to the base of QO1, shown as OscB, and to the emitter of QO1, depicted as OscE. By connecting a resonator in various well-known condition (e.g., Colpitts, Butler, etc.) QO1 will sustain an oscillation and thereby serves as an "on chip" oscillator. The frequency of the oscillation is dependent upon the resonator element used.

Transistor QO5 is a 10× device and provides the biasing of QO1. A 10× device indicates that there are actually ten transistors connected in parallel so that all of the bases, collectors and emitters respectively are connected to each other.

Transistor QO2 is connected in parallel with QO1 and serves as an on chip oscillator buffer. As a result of this parallel connection, QO2 will have the same signal at its base and emitter as that of QO1. The oscillation signal is taken from the emitter of QO2, and is identified as OscBuf. The OscBuf signal is taken from QO2 and not QO1 because taking the output from the emitter of QO1 would impact and alter the characteristics of the external resonator element, also connected to the emitter of QO1. The object is to keep QO1 undisturbed from any loading that results when you take the signal from the circuit. By adding the buffer of QO2, when you load QO2 by taking the signal from its emitter to drive another circuit, that load will not effect the operation of QO1. Transistor QO6 is a 10× device and provides the biasing of QO2.

DO1 acts as a protection device to QO1. DO2 is also a protection device for QO2. These protection devices prevent the accidental overload of the emitter of QO1, or the OscE connection with a high voltage signal. In this instance, DO1 will prevent the emitter voltage from exceeding the base voltage of QO1. Thus, since DO1 is arranged in opposite polarity with QO1, if the emitter voltage is brought higher than the base, DO1 will clamp the base-emitter junction of QO1. DO2 will operate the same as DO1.

QO3 and QO4 are biasing devices where the collector of QO3 and the base of QO4 are connected to a reference current source PTATIR4. The collector current of QO4 is designated as the IOFFSET signal which will be discussed further with the mixer.

Figure 3:
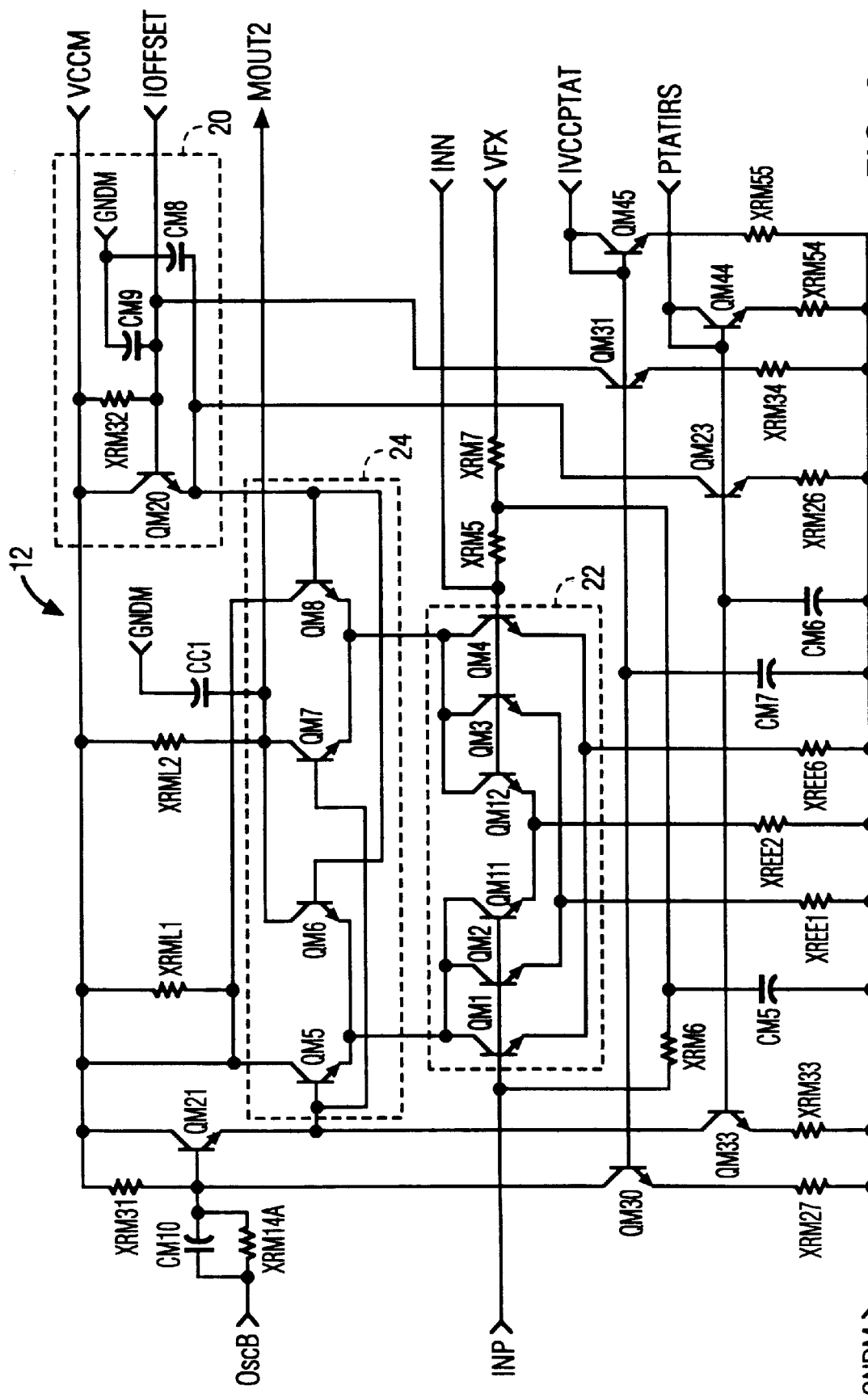
FIG. 3 is a schematic diagram of the mixer circuit of FIG. 1 according to the invention; and, FIG. 4 is a partial schematic diagram of the biasing network circuit of FIG. 1 according to the invention.

FIG. 3 is a schematic diagram of the complete mixer circuit. The core of the mixer is composed of a lower tree 22 and an upper tree 24. Lower tree 22 includes a triple differential amplifier made up of transistors QM1, QM2, QM11, QM12, QM3 and QM4. The use of a triple differential amplifier improves linearity and third order intermodulation products. The resistors XREE1, XREE2, and XREE6 provide the requisite biasing of the lower tree transistors. The upper tree 24 is made up of transistors QM5, QM6, QM7 and QM8.

Any offset or unbalanced situation will cause LO leakage into the output of the mixer. Thus, in order for the mixer to operate most efficiently, it is desireable to balance the upper tree of the mixer as equally as possible.

The oscillator 10 provides the LO frequency signal to the mixer at the OscB input. Transistor QM21 is the buffer transistor of the mixer and receives the LO signal at its base. QM21 is biased at its emitter by transistor QM33 and at its base by QM30. Capacitor CM10 and resistor XRM14A are filter components for increasing the signal level at high frequencies from the incoming LO signal.

A replicating stage 20 performs the same as buffer transistor QM21, except that it is does not have the oscillating signal at its input transistor. Replicating stage 20 provides a bias voltage to the base of transistors QM8 and QM6 in the upper tree 24 equal to the voltage signals received by QM5 and QM7 through QM21. Thus, QM20 and resistor XRM32 is replicating the oscillator/buffer circuit on the other side of the mixer formed by QM21 and XRM31 to achieve an internally balanced LO bias signal. This balances the mixer's upper tree at both sides and is required for a double balanced mixer.

Mixer 12 is a four terminal device having two inputs INP and INN for receiving the positive and negative RF inputs and two LO inputs which are generated internally by QM21 on one side and by QM20 of the replicating stage 22 on the other. Replicating stage 20 is primarily for balancing the LO signal bias within mixer 12.

Transistors QM44 and QM45 and resistors XRM54, XRM55 are bias generators which generate all the bias currents going to the different transistors of the circuit. PTATIR5 is a reference current source used for the bias generators. PTAT stands for proportional to absolute temperature, and IR stands for implant resistor. Thus, this is a PTAT current source which is generated using an implant resistor (IR). In order to make the circuit perform independently of temperature, the same kind of resistors must be used throughout the circuit, so that when you are determining the ratios, their temperature coefficients cancel each other. The circuitry for generating PTAT current sources is considered prior art and is not shown for brevity. The IVCCPTAT is a bias current signal generated by the bias network 14 and is a PTAT current source that is dependent on $V_{CC}$ variations. The input source VFX is a DC reference source or bias voltage generated by the bias network 14, and MOUT2 is the output of mixer 12.

Referring to FIGS. 2 and 3 together, the base currents for transistors QO5, QO6, and QO3 (with QO5 and QO6 being 10× devices) are all provided through transistor QO4. Thus, the collector current or IOFFSET current signal of QO4 is actually equal to the sum of the base currents of QO3, QO5 and QO6. The IOFFSET current signal is then fed into the mixer circuit at the base of QM20 in replicating stage 20. The addition of the IOFFSET signal to the replicating stage 20 compensates for different base currents that QM21 is seeing. QM21 is connected to the OscB terminal of the oscillator. The OscB of the oscillator is connected to the bases of QO1 and QO2, so the currents of QO1 and QO2 actually affect the bias of transistor QM21. Since OscB is connected to the base of QO1 and QO2 which are connected to the base of QM21, all of the base currents for these three transistors are provided by resistor XRM31 from $V_{CC}$.

If there is no IOFFSET current signal fed into the replicating stage, then the signal going to XRM32 is only the base current of QM20, which is less than the base current at QM21. In order for the base voltage of QM20 and QM21 to be exactly the same, the same amount of current must be flowing through resistors XRM32 and XRM31.

The IOFFSET current signal is generated by taking the collector current of QO4 and adding it to the base of QM20 so that now the current which is going through XRM32 is also the same as the current going through XRM31, and therefore we have the same base voltage for QM20 and QM21, and therefore the same base voltage for QM8 and QM5, respectively. The upper tree 24 of the mixer is now perfectly balanced and remains this way over temperature and $V_{CC}$ variations. In other words, IOFFSET generated as the collector current of QO4, tracks the base current of QO1, QO2 and QM21 to guarantee symmetric operation or a perfectly balanced local oscillation signal.

Capacitor CO1 of oscillator 10 is a filter capacitor to filter out any noise which might be coming in on the base of QO5 and QO6. The emitters of QO1 and QO2, OscE and OscBuf, respectively, are the output terminals or access points of this oscillator. The large junction capacitance of QO5 and QO6 (10× devices), will cause the large oscillator signal at OscE and OscBuf nodes to couple and come to the base of QO5 and QO6. By inserting capacitor CO1, we filter out or eliminate that potential problem. CO1 acts like a low pass filter in this instance.

With limiting voltage headroom under low $V_{CC}$ conditions, second order effects like clipping of the small IF output riding on the large LO feed-through, will reduce the mixer gain as well as produce unwanted spurious products. The use of capacitor CC1 on the output MOUT reduces the leaked LO and RF levels in the output, thereby preventing signal clipping. Another second order effect is the LO leakage from QM5's emitter (or QM1's collector) to the base of QM1. This leaked signal behaves like an RF signal and re-enters the mixer. This in effect, is like the LO signal mixing with itself which results in a negative DC shift on the QM5 collector. QM5's collector is tied to $V_{CC}$ and the IF signal is picked from the collector of QM7, thereby preventing premature limiting.

Figure 4:
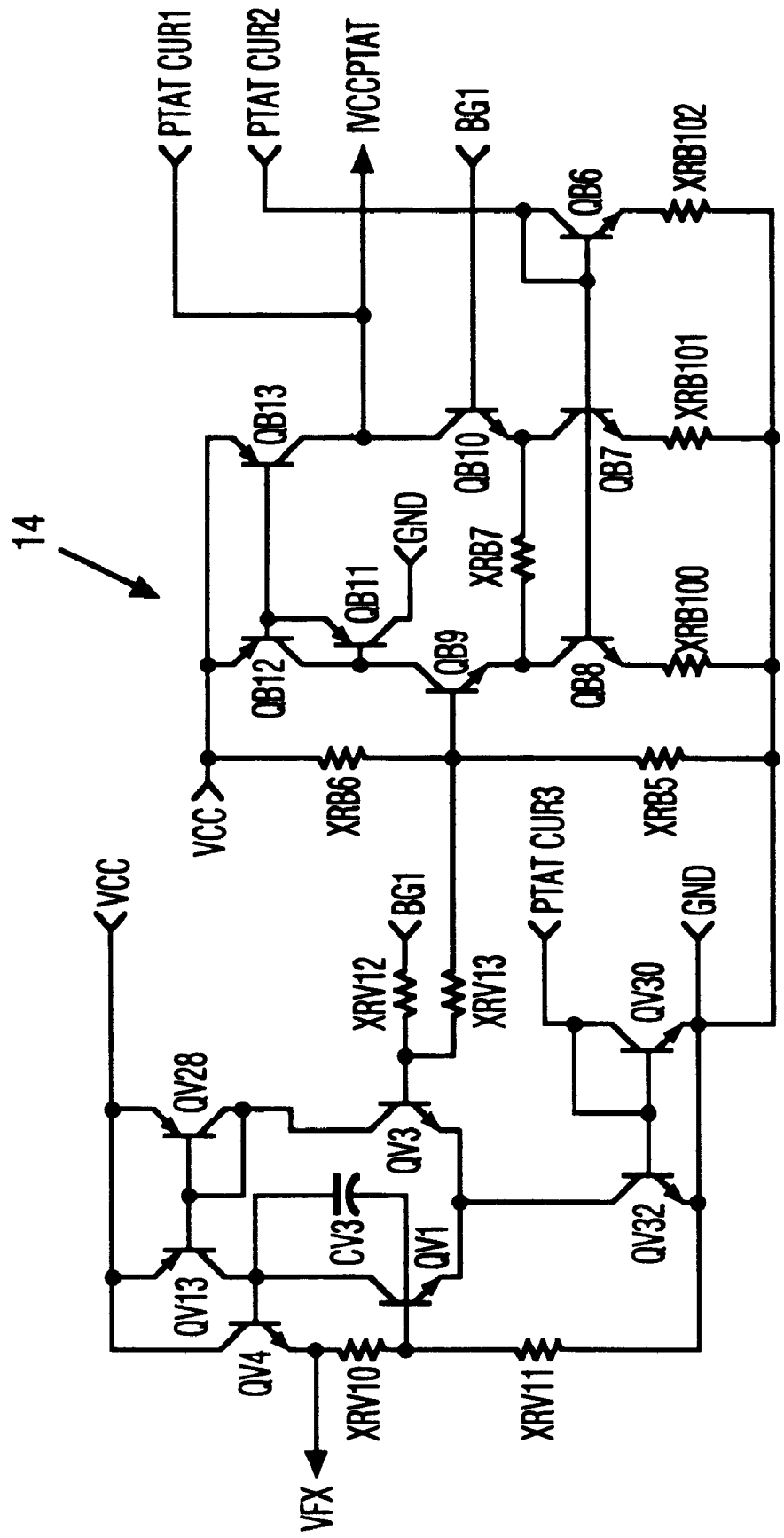

FIG. 4 is simplified example of the biasing network according to the invention. The biasing circuit generates the VFX and IVCCPTAT bias signals for the mixer circuit. To generate these signals, a standard on-chip generated band gap voltage BG1 is applied to the circuit. The band gap voltage does not change with the temperature and is fixed for silicon at 1.23 volts to the first order.

The VFX signal is generated on the left hand side of the circuit. The VFX signal is generated from the band gap voltage BG1, but has a different absolute value which is more appropriate for the mixer. BG1 is applied to the base of transistor QV3. Transistors QV1, QV3, QV28, QV13, and QV4 and resistors XRV11 and XRV10 and the biasing transistor QV32 together form a non-inverting operational amplifier with a gain ratio of the resistors XRV10 and XRV11. The VFX voltage signal is then proportional to band gap voltage BG1 with a resistor ratio of XRV10 and XRV11. The current source PTAT CUR3 is a reference current source used to bias transistor QV32.

The IVCCPTAT bias signal is generated on the right hand of the circuit. The IVCCPTAT signal is also generated from the same band gap voltage BG1 going over transistors QB9 and QB10. The current generated by the voltage difference converted over resistor XRB7 is called IVCCPTAT. The IVCCPTAT signal is dependent on the $V_{CC}$ because as $V_{CC}$ changes, the voltage at the base of QB9 changes. In addition, the resistor ratio of XRB6 and XRB7 changes as the $V_{CC}$ changes. This difference is then translated over resistor XRB7 and turned into the desired IVCCPTAT bias signal. The remaining current sources PTAT CUR1 and PTAT CUR2 are just reference current sources for the circuit.

The voltage on resistor XRM31 in FIG. 3, is used to control the voltage on the emitter of QM5 for optimized signal swing headroom at all $V_{CC}$ and temperature conditions. The bias current IVCCPTAT has a $V_{CC}$ dependent value for this purpose. The use of a bias voltage (VFX) on the lower tree 22 of the mixer, which is also weakly dependent on $V_{CC}$ results in optimized headroom, linearity and gain in all $V_{CC}$ levels.

While one embodiment of the present invention has been shown and described, it is to be understood that many changes and modifications may be made thereunto without departing from the spirit and scope of the invention as defined in the appended claims.

What is claimed is:

1. A low voltage temperature and $V_{CC}$ compensated RF mixer, comprising:
    an oscillator circuit for externally producing a local oscillator (LO) signal and an offset current signal;
    a bias network for producing a bias voltage signal and a bias current signal; and
    a mixer circuit connected to said oscillator circuit and said bias network, said mixer circuit comprising internal oscillating means for receiving the LO signal and generating an internal LO signal;
    a replicating stage for receiving the offset current signal and balancing the internally generated LO bias signal within the mixer, said internal oscillating means and said replicating stage receiving the bias current signal;
    an upper tree circuit for receiving the internally balanced LO signal; and
    a lower tree circuit for receiving the RF input and said bias voltage signal, said upper tree circuit and said lower tree circuit being connected to mix the RF input and the internally balanced LO signal to produce said IF output.

2. The RF mixer according to claim 1, wherein said lower tree circuit of said mixer comprises a triple differential amplifier.

3. The RF mixer according to claim 1, wherein said upper tree circuit comprises a first and second pair of transistors.

4. The RF mixer according to claim 1, wherein said internal oscillating means comprises an oscillating transistor.

5. The RF mixer according to claim 1, wherein said bias current signal is dependent on the value of $V_{CC}$ and biases said internal oscillating means and said replicating stage to provide optimized signal swing headroom at all $V_{CC}$ and temperature levels.

6. The RF mixer according to claim 1, wherein said bias voltage signal biases said lower tree circuit of said mixer to optimize headroom, linearity and gain in all $V_{CC}$ levels.

7. The RF mixer according to claim 1, wherein said replicating stage comprises a transistor, and a resistor connected to the base of said transistor at one end, and to the $V_{CC}$ terminal at the opposite end.

8. The RF mixer according to claim 7, wherein said replicating stage generates identical bias signals to the bias signals generated at said internal oscillating means in response to said offset signals.

9. A method of producing a temperature and $V_{CC}$ compensated IF signal comprising the steps of:
    inputting an RF signal into a mixer;
    generating an external local oscillator (LO) signal and an offset current signal with an oscillator circuit;
    generating a bias voltage and a bias current with a bias network, said bias current signal being dependent on the value of $V_{CC}$;
    applying the externally generated LO signal to the mixer:
    generating an internal LO signal with an oscillating transistor for applying to an upper tree circuit of the mixer;
    applying the offset current signal to a replicating stage within the mixer to balance the internally generated LO bias signal applied to the upper tree circuit of the mixer;
    applying the bias voltage signal to a lower tree circuit of the mixer to eliminate the $V_{CC}$ dependency of the lower tree circuit;
    applying the bias current signal to the oscillating transistor and the replicating stage of the mixer to further balance the internally generated LO signal applied to the upper tree circuit of the mixer;
    mixing the internally bias balanced LO signal in the upper tree circuit with the RF input of the lower tree circuit;
    generating an IF signal representative of all input signals;
    low pass filtering the IF output on one side for improved linearity and reduced intermodulation products; and
    connecting the mixer's differential output to $V_{CC}$ so as to prevent unwanted DC shifts due to LO's self-mixing.

10. A circuit, comprising:
    a voltage supply Vcc;
    an RF mixer circuit coupled to said voltage supply, said RF mixer circuit including
        an input for receiving an externally generated local oscillator signal,
        internal oscillating means for generating a first internal oscillator signal from said external oscillator signal,
        a replicator stage for generating a second, internal local oscillator signal balanced with respect to said first internal oscillator signal,
        an upper tree circuit for receiving the balanced local oscillator signals and a lower tree circuit for receiving an RF input, said upper tree circuit and said lower tree circuit being connected to mix the RF input and the internally balanced LO signal to produce an IF output signal representative of the input signals; and
    a bias circuit for generating a temperature compensating bias current signal dependent on temperature and on the value of Vcc, said bias current signal biasing said internal oscillating means and said replicator stage to provide optimized signal swing headroom at different Vcc and temperature levels.

11. A circuit, comprising:
    a voltage supply Vcc;
    an RF mixer circuit coupled to said voltage supply, said RF mixer circuit including
        an input for receiving an externally generated local oscillator signal,
        internal oscillating means for generating a first internal oscillator signal from said external oscillator signal,
        a replicator stage for generating a second, internal local oscillator signal balanced with respect to said first internal oscillator signal, an upper tree circuit for receiving the balanced local oscillator signals and a lower tree circuit for receiving an RF input and a bias voltage signal, said upper tree circuit and said lower tree circuit being connected to mix the RF input and the internally balanced LO signal to produce an IF output signal representative of the input signals; and a bias circuit for generating a voltage bias signal dependent on the value of Vcc, said voltage bias signal biasing said lower tree circuit of said mixer to maximize headroom, linearity and gain across a range of Vcc values.

* * * * *